US007816769B2

(12) United States Patent
Lam

(10) Patent No.: US 7,816,769 B2
(45) Date of Patent: Oct. 19, 2010

(54) STACKABLE PACKAGES FOR THREE-DIMENSIONAL PACKAGING OF SEMICONDUCTOR DICE

(75) Inventor: Ken M. Lam, Colorado Springs, CO (US)

(73) Assignee: Atmel Corporation, San Jose, CA (US)

( * ) Notice: Subject to any disclaimer, the term of this patent is extended or adjusted under 35 U.S.C. 154(b) by 92 days.

(21) Appl. No.: 11/467,786

(22) Filed: Aug. 28, 2006

(65) Prior Publication Data

US 2008/0048308 A1 Feb. 28, 2008

(51) Int. Cl.
*H01L 23/495* (2006.01)
*H01L 23/48* (2006.01)
(52) U.S. Cl. .................. 257/666; 257/686; 257/784; 257/787; 257/E23.043
(58) Field of Classification Search ............... 257/686, 257/E23.181, 666, 784, E23.043, 787
See application file for complete search history.

(56) References Cited

U.S. PATENT DOCUMENTS

| 5,157,475 | A | * | 10/1992 | Yamaguchi | 257/784 |
|---|---|---|---|---|---|
| 5,422,514 | A | * | 6/1995 | Griswold et al. | 257/679 |
| 5,541,449 | A | * | 7/1996 | Crane et al. | 257/697 |
| 5,835,988 | A | * | 11/1998 | Ishii | 257/684 |
| 6,061,251 | A | * | 5/2000 | Hutchison et al. | 361/820 |
| 6,525,406 | B1 | * | 2/2003 | Chung et al. | 257/666 |
| 6,563,217 | B2 | | 5/2003 | Corisis et al. | |
| 6,667,544 | B1 | * | 12/2003 | Glenn | 257/686 |
| 6,674,159 | B1 | | 1/2004 | Peterson et al. | |
| 6,710,246 | B1 | | 3/2004 | Mostafazadeh et al. | |
| 6,812,552 | B2 | * | 11/2004 | Islam et al. | 257/666 |
| 6,838,768 | B2 | | 1/2005 | Corisis et al. | |
| 7,385,299 | B2 | * | 6/2008 | Chow et al. | 257/787 |

| 2002/0022300 | A1 | 2/2002 | Shin |
|---|---|---|---|
| 2002/0125571 | A1 | 9/2002 | Corisis et al. |
| 2003/0038378 | A1 | 2/2003 | Jacobs |

(Continued)

FOREIGN PATENT DOCUMENTS

CN 2613047 4/2004

(Continued)

OTHER PUBLICATIONS

"International Application No. PCT/US2007/075191 (Atty. Ref. 2800.617WO1 ), Written Opinion Mailed May 27, 2008", 5 pages.

(Continued)

*Primary Examiner*—Nitin Parekh
(74) *Attorney, Agent, or Firm*—Schwegman, Lundberg & Woessner, P.A.

(57) ABSTRACT

An apparatus and a method for packaging semiconductor devices. The apparatus includes a substrate strip component of a leadless three-dimensional stackable semiconductor package having mounting contacts on, for example, four peripheral edges. The substrate strip may either be fabricated for mounting a single electrical component (e.g., an integrated circuit die) or a plurality of substrate strips may be laid out in an X-Y matrix pattern which may later be singulated into individual package strip for leadless packages. Three-dimensional stacking is achieved by a bonding area on an uppermost portion of the sidewall. The sidewall of the strip is high enough to enclose an encapsulant covering a later mounted integrated circuit die and associated bonding wires.

14 Claims, 7 Drawing Sheets

U.S. PATENT DOCUMENTS

| | | |
|---|---|---|
| 2003/0197271 A1 | 10/2003 | Corisis et al. |
| 2005/0067680 A1 | 3/2005 | Boon et al. |
| 2005/0110135 A1 | 5/2005 | Corisis et al. |
| 2006/0027908 A1 | 2/2006 | Chang et al. |

FOREIGN PATENT DOCUMENTS

| | | |
|---|---|---|
| WO | WO 2005022591 A2 | 3/2005 |
| WO | WO-2008/027694 A2 | 3/2008 |
| WO | WO-2008/027694 A3 | 3/2008 |

OTHER PUBLICATIONS

"International Application Serial No. PCT/US2007/075191 (Atty. Ref. 2800.617WO1), International Searched Report mailed May 27, 2008", 3 pages.

U.S. Pat. Application (incl. drawings) entitled "Component Stacking for Integrated Circuit Electronic Package", Filed: Dec. 20, 2005, Assignee: Atmel Corporation, Inventor: Ken M. Lam.

"Chinese Application Serial No. 200780032009.9, Office Action mailed Mar. 10, 2010", 11 pgs.

"Chinese Application Serial No. 200780032009.9, Response to Office Action mailed," Mar. 10, 2010, 5 pgs.

* cited by examiner

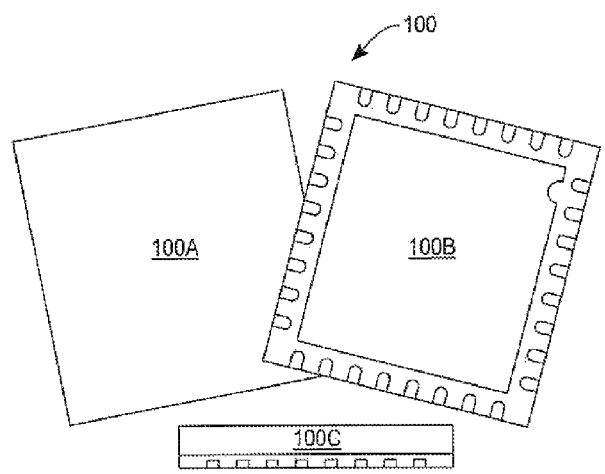
Fig._1A
*(Prior Art)*
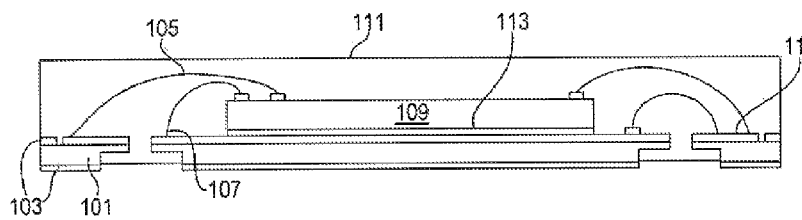
Fig._1B
*(Prior Art)*
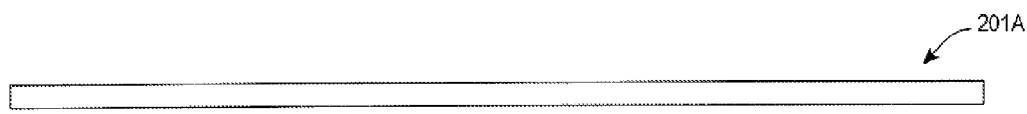
Fig._2A
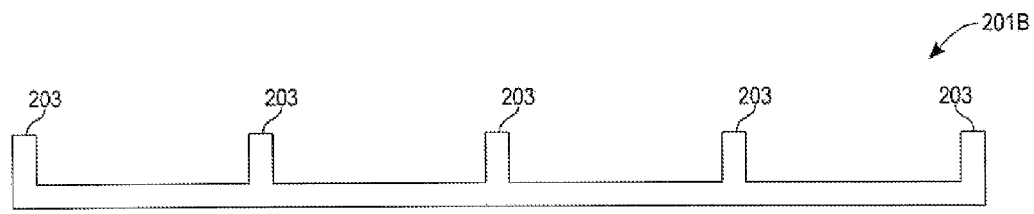
Fig._2B

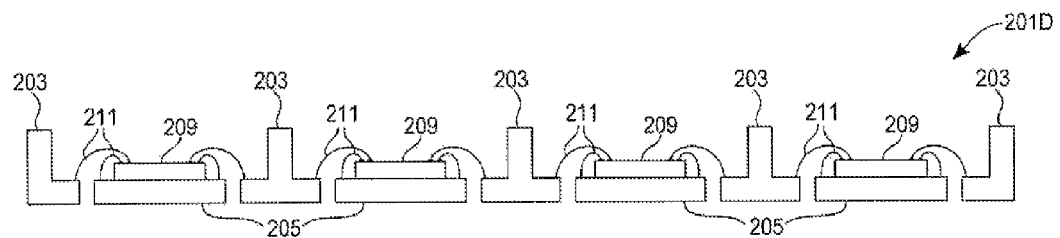
Fig._ 2D
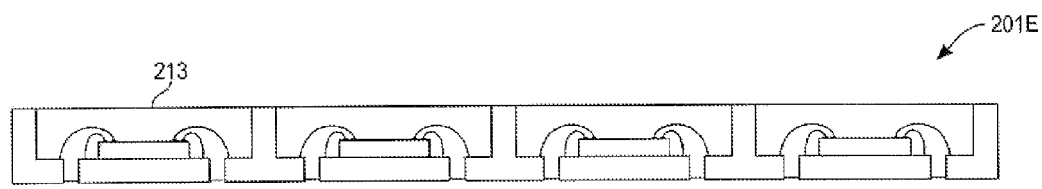
Fig._ 2E
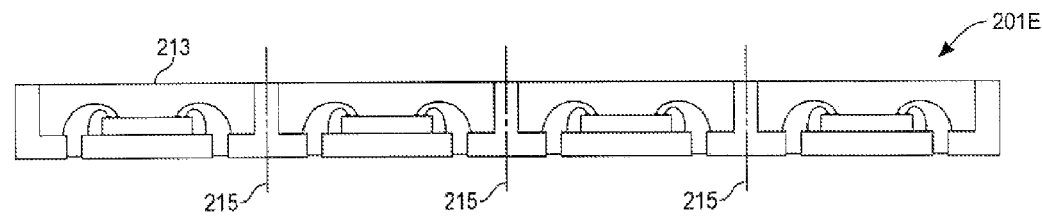
Fig._ 2F

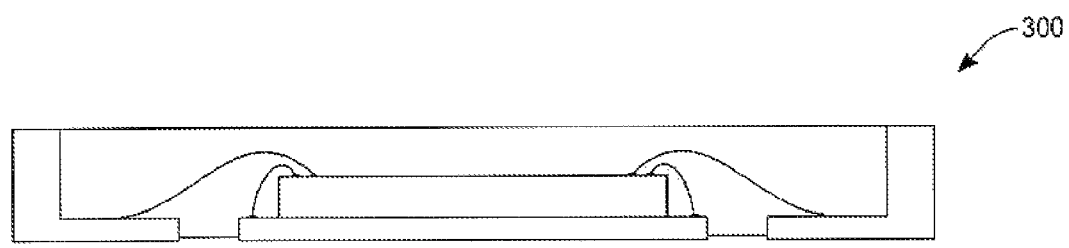
*Fig._3A*
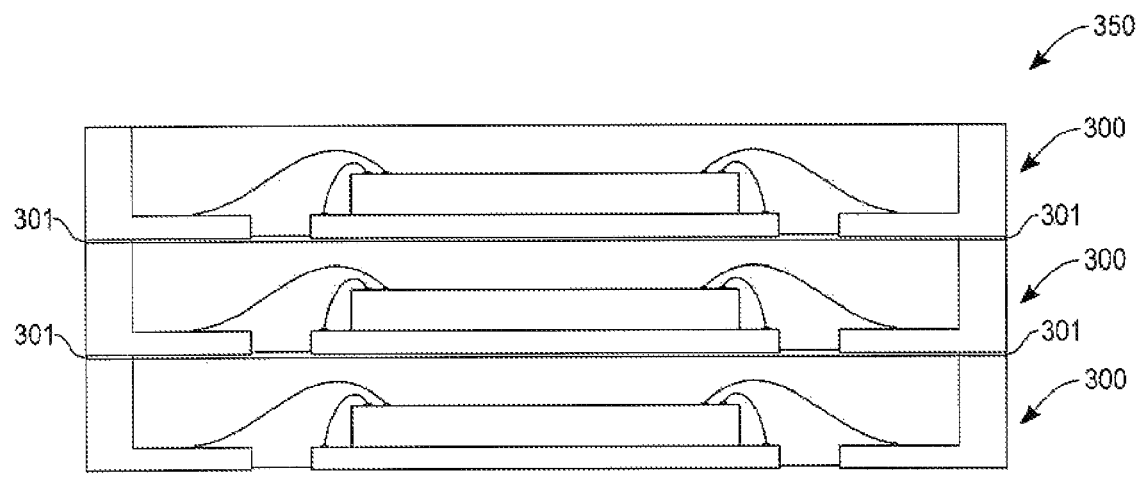
*Fig._3B*

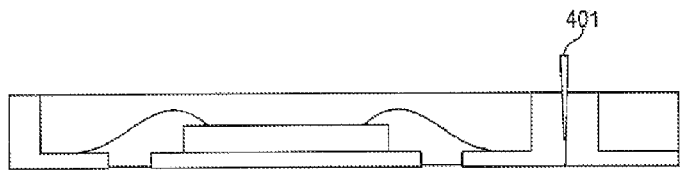
Fig._4A
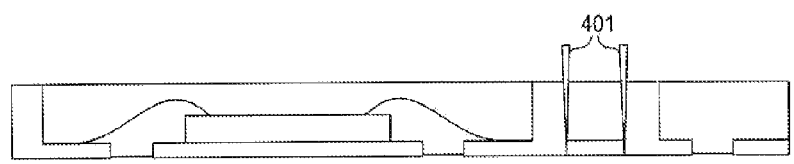
Fig._4B
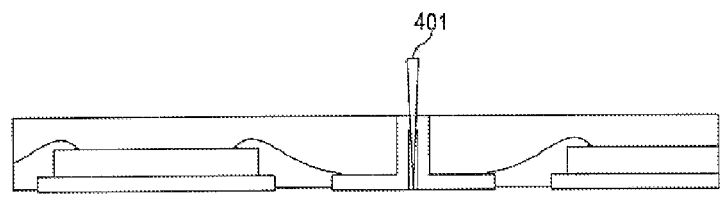
Fig._4C
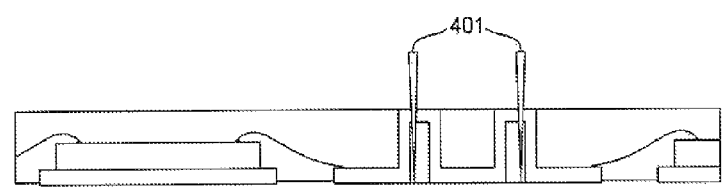
Fig._4D

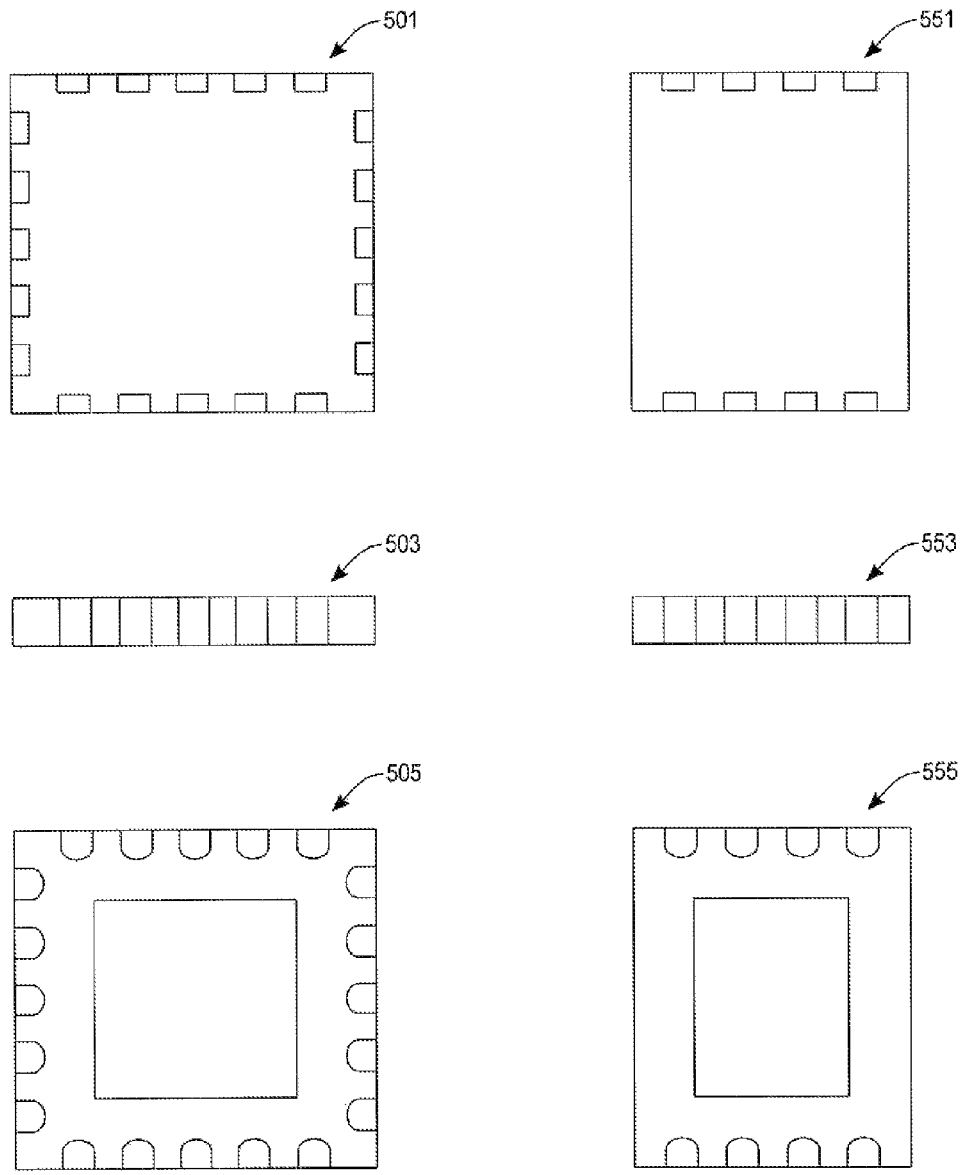
Fig. _ 5

STACKABLE PACKAGES FOR THREE-DIMENSIONAL PACKAGING OF SEMICONDUCTOR DICE

TECHNICAL FIELD

The invention relates to a three-dimensional stackable semiconductor package, and more particularly, to a three-dimensional stackable semiconductor package for package types involving no-lead packages.

BACKGROUND ART

As semiconductor integrated circuit chips become more multi-functional and highly integrated, the chips include more bonding pads (or terminal pads), and thus packages for the chips have more external terminals (or leads). When a conventional plastic package having leads along the perimeter of the package must accommodate a large number of electrical connection points, the footprint of the package increases. However, a goal in many electronic systems is to minimize an overall size of the systems. Thus, to accommodate a large number of pins without increasing the footprint of package, pin pitch (or lead pitch) of the package must decrease. However, a pin pitch of less that about 0.4 mm gives rise to many technical concerns. For example, trimming of a package having a pin pitch less than 0.4 mm requires expensive trimming tools, and the leads are prone to bending during handling of the package. In addition, surface-mounting of such packages demands a costly and complicated surface-mounting process due to a required critical alignment step.

Thus, to avoid technical problems associated with conventional fine-pitch packages, packages that have area array or leadless external terminals have been suggested. Among these packages are ball grid array packages, chip scale packages, Quad Flat-Pack No-Lead (QFN) packages, and Dual Flat-Pack No-Lead (DFN) packages. The semiconductor industry presently uses a number of chip scale packages. A micro ball grid array package (µBGA) and a bump chip carrier (BCC) are examples of the chip scale packages. The µBGA package includes a polyimide tape on which a conductive pattern is formed and employs a totally different manufacturing process from a conventional plastic packaging. The bump chip carrier package includes a substrate having grooves formed around a central portion of a top surface of a copper alloy plate and an electroplating layer formed in the groves. Accordingly, chip scale packages use specialized packaging materials and processes that increase package manufacturing costs.

FIG. 1A is a typical plastic encapsulated package 100 of the prior art (showing top 100A, bottom 100B, and side views 100C of the package). Specifically, the encapsulated package 100 is a QFN package. The QFN package 100 is a leadless package where electrical contact to a printed circuit board (PCB) is made by soldering lands on the bottom 100B surface of the package 100 to the PCB, instead of more traditional formed perimeter leads being soldered to the PCB.

FIG. 1B is a cross-sectional view of the prior art QFN package 100 in use and includes a copper land 101, a plurality of solder plating areas 103, a plurality of gold lead wires 105, and a down bond area 107. The copper land 101 frequently has a plating material 115 applied, such as silver, to facilitate gold or aluminum wire bonding (not shown). An integrated circuit die 109 is attached to the QFN package 100 with a suitable die attach material 113, such as a thermal epoxy. A mold compound 111 or other covering material is applied to finalize the QFN package 100.

Therefore, an integrated circuit package such as a QFN or DFN that uses conventional packaging materials and processes can only be accessed for electrical interconnection, for example, to a printed circuit board, by lower portions of the copper leadframe 101/plating area 103 (FIG. 1B) which are found only on the bottom surface of the package. Consequently, what is needed to provide for a higher density of integrated circuit packaging into a given printed circuit board footprint is a means of allowing the integrated circuit packages to be readily stacked, one atop another, or even side-by-side.

SUMMARY

In one exemplary embodiment, the present invention is a substrate strip component of a leadless three-dimensional stackable semiconductor package having mounting contracts on, for example, top, bottom, and sides of four peripheral edges. The substrate strip may either be fabricated for mounting a single electrical component (e.g., an integrated circuit die) or a plurality of substrate strips may be laid out in an X-Y matrix pattern. The matrix of strips may later be singulated into individual package strips for leadless packages.

Each of the substrate strips includes a leadless outer portion having a plurality of sections electrically isolated from each other. Each of the sections has a flat wire bonding area and a sidewall area that is essentially perpendicular to the flat wire bonding area. The sidewall area is concentrically located on an outermost periphery of the outer portion.

Each substrate strip also includes an inner portion located concentrically within and electrically isolated from the outer portion. The inner portion is thinner than the sidewall area of the outer portion and is designed to serve as an attachment area for an integrated circuit die or other electrical component. A combined thickness of the inner portion and the integrated circuit die (or component) is less than a height of the sidewall area. This mounting arrangement leaves an uppermost portion of the sidewall areas electrically exposed for mounting additional leadless packages or other components on top of the first package.

In another exemplary embodiment, a substrate strip component of a leadless three-dimensional stackable semiconductor package has mounting contacts on, for example, top, bottom, and sides of two opposing (e.g., parallel) edges. The substrate strip may either be fabricated for mounting a single electrical component (e.g., an integrated circuit die) or a plurality of substrate strips may be laid out in an X-Y matrix pattern. The matrix of strips may later be singulated into individual package strip for leadless packages.

In this embodiment, the substrate strip has a pair of parallel leadless outer portions. Each leadless outer portion has a plurality of sections electrically isolated from each other. Each section also has a flat wire bonding area and a sidewall area essentially perpendicular to the flat wire bonding area, the sidewall area being located on an outermost edge of each of the outer portions.

An inner portion is located between and electrically isolated from the pair of outer portions. The inner portion is thinner than the sidewall area of the parallel outer portions and is designed to serve as an attachment area for an integrated circuit die or other electrical component. A combined thickness of the inner portion and the integrated circuit die (or component) is less than a height of the sidewall area. This mounting arrangement leaves an uppermost portion of the sidewall areas electrically exposed for mounting additional leadless packages or other components on top of the first package.

In another exemplary embodiment, the present invention is a method of packaging a semiconductor device. The method includes mounting an electrical component to an inner portion die pad where the die pad is a portion of a substrate strip component of a first leadless three-dimensional stackable semiconductor package. A plurality of bond wires is secured from a plurality of bond pads on the electrical component to corresponding ones of a plurality of wirebond pads contained on a leadless outer portion of the substrate strip component. The outer portion has a sidewall that has a height greater than a combined height of the electrical component and the inner portion die pad.

The electrical component, bond wires, and any exposed portions of the die pad are then covered with an encapsulating material to a level at or near the uppermost portion of the sidewalls on the leadless outer portion.

BRIEF DESCRIPTION OF THE DRAWINGS

FIGS. 1A and 1B show a QFN chip carrier package of the prior art.

FIGS. 2A-2F show exemplary cross-sections or plan views of stackable integrated circuit die and discrete component carriers in accord with the present invention.

FIGS. 3A and 3B show singulated packages in single and stacked configurations.

FIGS. 4A-4D show various cross-sectional embodiments allowing for differing arrangements of layouts for singulation.

FIG. 5 shows completed exterior views of specific embodiments of QFN and DFN packages in accord with general embodiments of the present invention.

DETAILED DESCRIPTION

In FIG. 2A, a substrate strip 201A is selected to have a thickness close to a final "height" of a completed package. The height chosen for the substrate strip 201A will be based on particular components placed in the final package but will typically vary from 0.2 mm to 2 mm. Additional details to determine an actual height for a given package will be discussed in greater detail, infra.

Processes described herein refer to exemplary embodiments where many packages are formed in an X-Y matrix, although a single package could readily be formed by the same process as well. The X-Y matrix size for the substrate strip 201A may be chosen to suit a particular vendor's tooling. In a specific exemplary embodiment, the X-Y dimensions of the substrate may be 205 mm×60 mm and the construction material is selected to be copper. In other exemplary embodiments, the substrate 201A may be another type of metallic or non-metallic material. The material may be either electrically conductive or electrically non-conductive. Additionally, non-rectangular matrix shapes are contemplated.

In FIG. 2B, the substrate strip 201A is pattern-etched, leaving an etched substrate strip 201B. During the pattern-etching process, a bottom thickness of the substrate strip 201A is reduced while leaving essentially full height sidewalls 203. Pattern forming and pattern-etching steps are known in the art and will vary depending upon material chosen. Areas between the sidewalls 203 are reduced thickness areas. Portions of these areas will serve as a die pad mounting area in subsequent steps. Thus, the sidewalls 203 are areas substantially perpendicular to the reduced thickness areas. A height of the sidewalls is selected to be sufficient such that any mounted integrated circuit and bonding leads contained within the package will be at or below an uppermost portion of the sidewalls 203. Other portions of the bottom thickness will later serve as bond fingers. In a specific exemplary embodiment, bottom portions of the etched substrate strip 201B are reduced to about 0.12 mm (approximately 5 mils) in height.

Figure 2C:
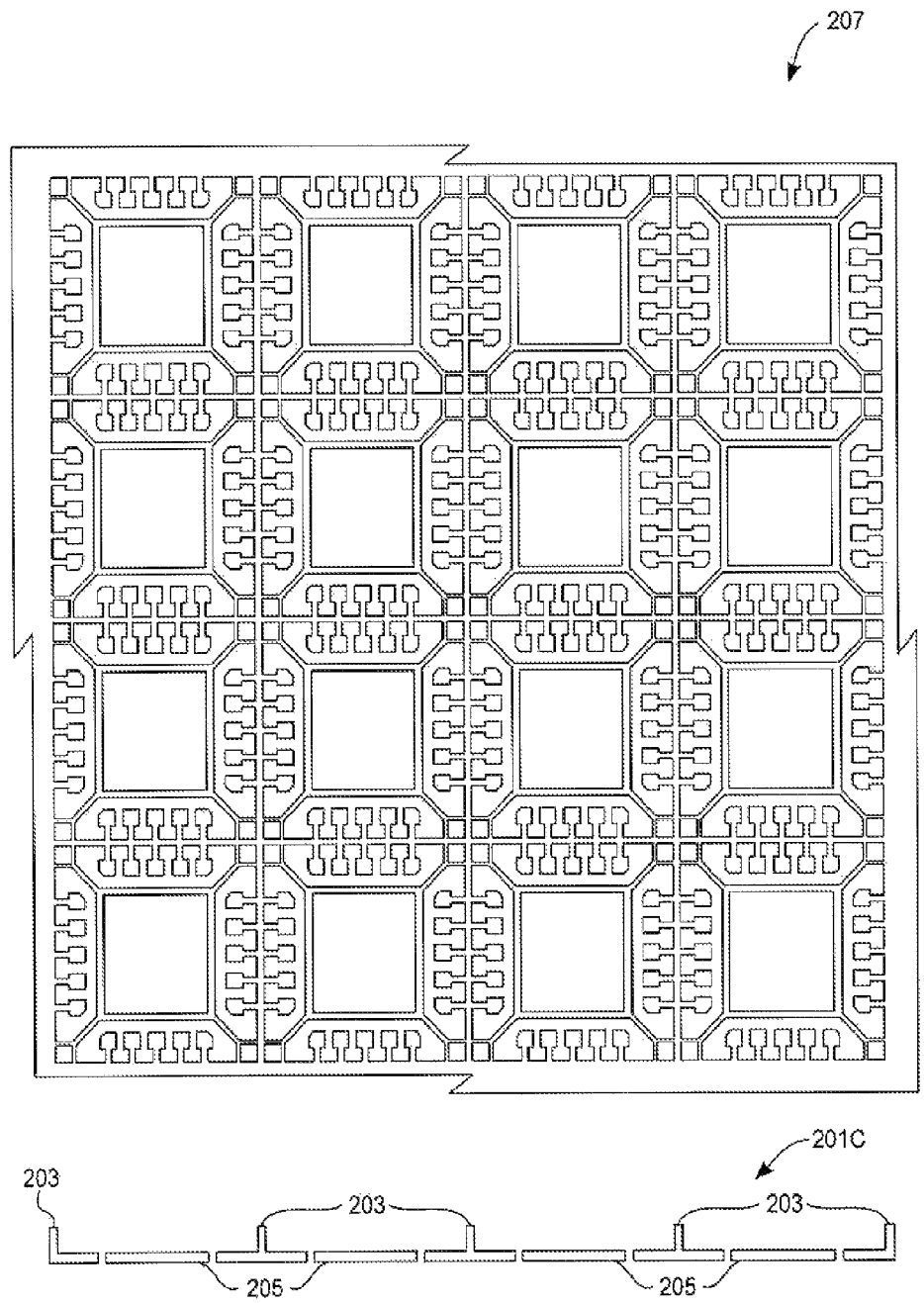

With reference to FIG. 2C, the etched substrate strip 201B is further pattern-etched forming a leadframe substrate strip 201C. The leadframe substrate strip 201C includes die attach pads 205 and the sidewalls 203 are further etched defining separate bond finger features as seen in plan-view 207. The plan-view 207 shows a portion of the exemplary 205 mm×60 mm substrate. As viewed jointly in cross-sectional and plan-view, the bond fingers have integral sidewalls 203 which remain substantially the full height of the leadframe substrate strip 201C. The die attach pads 205 are electrically isolated from the bond finger/integral sidewalls 203 due to the pattern-etch step. In a specific exemplary embodiment, exposed areas of the leadframe substrate strip 201C are either fully-plated or spot-plated with, for example, silver. In other exemplary embodiments, the leadframe substrate strip 201C is fully plated with a wire-bondable metal and solderable metal layers. For example, the leadframe substrate strip 201C may be a leadframe with a nickel-palladium-gold (Ni—PD—Au) plating. A high-temperature polyamide tape may be used to secure all package portions in position.

In FIG. 2D, an etched leadframe substrate strip 201D is populated by adhering (e.g., via a standard thermal epoxy or adhesive tape) individual integrated circuit dice 209 to the die attach pads 205. Various adhering techniques and processes are known in the industry. Bonding wires 211 are then attached to electrically connect to portions of the etched leadframe substrate strip 201D.

With reference to FIG. 2E, a populated leadframe strip 201E is then encapsulated with an epoxy mold compound 213. Encapsulation techniques are well-known in the art. After encapsulation, exposed portions of the populated leadframe strip 201E are then plated with, for example, tin (Sn), a tin-alloy, Ni/Au or other plating materials possessing characteristics of being electrically-conductive and solderable. The plating allows for good electrical connections when the final package is mounted to a PCB or another die package. If the leadframe substrate strip is pre-plated, this final plating step is unnecessary.

In FIG. 2F, the populated leadframe strip 201E is then singulated by standard techniques such as sawing or laser-cutting along a plurality of saw-lines 215. After the singulation process, a plurality of QFN-type packages are produced. Each of the sidewalls 203, which are a full-height integral part of the formed bond finger features (FIG. 2C) carry an electrical signal from a lower portion of the package to an upper portion of the package. Thus, all electrical signals are available on both upper and lower portions of the final package so three-dimensional stacking of packages is possible.

Alternatively, a skilled artisan can readily envision modifications to the above-described processes wherein DFN-type packages are produced. DFN-type packages have external connection points on two parallel opposing edges of the package rather than on all four edges as with the QFN-type package.

With reference to FIG. 3A, a singulated DFN-type or QFN-type package 300 is shown in cross-section. (Note that either the QFN-type or DFN-type package appears similar to the other in cross-section). The singulated DFN-type or QFN-type package 300 can be used as a single package and mounted to a PCB or other structure directly. Alternatively, as shown in FIG. 3B, three singulated DFN-type or QFN-type packages 300 are stacked in a three-dimensional structure 350. Each of the singulated packages 300 is electrically connected to the other by, for example, solder joints 301.

FIGS. 4A through 4D indicate alternative embodiments for the substrate strip explained in detail with reference to FIGS. 2A through 2F, supra. A singulation saw 401 (or laser or other singulation method) placement provides an indication of some various arrangements of sidewalls. For comparison purposes, a common sidewall approach of FIG. 4A is the same solid common wall approach described with reference to FIGS. 2A through 2F, supra.

FIG. 4B is an alternate configuration for a sidewall design. A "gap" located between the two singulation saws 401 was formed during the leadframe substrate strip etching process (FIG. 2C). Leaving the gap results in less metal sidewall for the singulation saw 401, thus decreasing sawing time while reducing blade wear.

FIG. 4C indicates a wall arrangement where a gap has been left on the underside of the sidewall. Such an arrangement may be achieved by, for example, two-sided etching. Alternatively, the underside gap may be formed by mechanical means such as punching or stamping.

A dual sidewall arrangement of FIG. 4D is formed similarly to the formation method described with reference to FIG. 4C.

With reference to FIG. 5, various views of completed QFN-type (on the left, 501, 503, 505) and DFN-type (on the right, 551, 553, 555) packages fabricated in accord with exemplary embodiments of the present invention described herein are shown. Top views 501, 551, side views 503, 553, and bottom views 505, 555 are given to visualize completed packages with reference to QFN-type and DFN-type packages respectively. As noted particularly with regard to the bottom views 505, 555, a thermal enhancement of each of the package types is achieved by having a bottom portion of the die attach paddle exposed. The die attach paddle thus arranged provides an efficient conductive thermal path when soldered directly to a PCB. Alternatively, thermal conduction can be achieved through, for example, a thermally-conductive epoxy as well. This thermal enhancement can additionally provide a stable ground by use of down bonds or by electrical connection through a conductive die attach material.

Figure 6A:
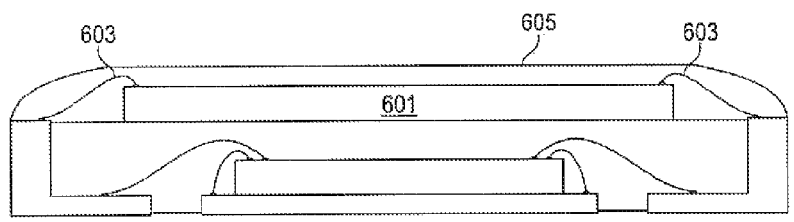
FIGS. 6A and 6B show singulated packages stacked with separate integrated circuit dice and discrete components.

In an alternative three-dimensional stacking arrangement of FIG. 6A, an integrated circuit die 601 is attached directly over a sigulated package 300 (FIG. 3A). The integrated circuit die 601 is electrically attached to the singulated package by a plurality of bonding wires 603. An optional encapsulant 605 may be added over the integrated circuit die 601 and the plurality of bonding wires 603. The encapsulant 605 may be applied by molding or dispensing techniques, both of which are known in the art. In a specific exemplary embodiment, the encapsulant 605 may be translucent such that any optical properties of the integrated circuit die 601 may be accessed through the translucent encapsulant 605 (e.g., an LED, optical laser, or EPROM).

Figure 6B:
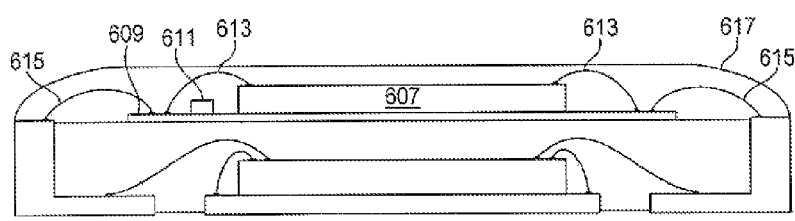

In another alternative stacking arrangement of FIG. 6B, an integrated circuit die or discrete component 607 may be pre-mounted on a circuit substrate (e.g., a small daughterboard). Additionally, one or more optional discrete components 611 may be mounted to the circuitry substrate 609. The integrated circuit die or discrete component 607 and the one or more optional discrete components 611 are electrically connected to the circuitry substrate 609 by a plurality of substrate bonding wires 613 or direct electrical connections (not shown) to the circuitry substrate 609. The circuitry substrate 609, in turn, is electrically connected to the singulated package by a plurality of package bonding wires 615. An optional encapsulant 617 may be added over the integrated circuit die or discrete component 607, the one or more optional discrete components 611, the circuitry substrate 609, and the plurality of bonding wire 613, 615. The encapsulant 617 may be applied by molding or dispensing techniques, both of which are know in the art. In a specific exemplary embodiment, the encapsulant 617 may be translucent such that any optical properties of the integrated circuit die or discrete components 607, 611 may be accessed through the translucent encapsulant 617 (e.g., and LED, optical laser, or EPROM).

In the foregoing specification, the present invention has been described with reference to specific embodiments thereof. It will, however, be evident to a skilled artisan that various modifications and changes can be made thereto without departing from the broader spirit and scope of the invention as set forth in the appended claims. For example, skilled artisans will appreciate that embodiments of the present invention may be readily applied to modified versions of TAPP® (thin array plastic package), ULGA® (ultra-thin land grid array), BCC® (bumped chip carrier), or other similar package types. The specification and drawings are, accordingly, to be regarded in an illustrative rather than a restrictive sense.

What is claimed is:

1. A substrate strip of a leadless three-dimensional stackable semiconductor package, the substrate strip comprising:
   an integrated circuit die mounting area including:
   a leadless outer portion, the leadless outer portion including a plurality of sections electrically isolated from each other and having a flat wire bonding area and a sidewall essentially perpendicular to the flat wire bonding area, the flat wire bonding area and the sidewall being formed from a same material, an outer side surface of the sidewall being disposed at and forming a substantially continuous outermost edge of the integrated circuit die mounting area; and
   an inner portion located within and electrically isolated from the outer portion, the inner portion having a thickness that is less than a height of the sidewall of the outer portion and being configured to serve as an attachment area for an integrated circuit die, the thickness of the inner portion configured such that a top surface of an attached integrated circuit die is disposed below a top of the sidewall area.

2. The substrate strip of claim 1, wherein a plurality of integrated circuit die mounting areas are arranged in a matrix pattern.

3. The substrate strip of claim 1, wherein the outer portion and the inner portion comprise copper.

4. The substrate strip of claim 3, wherein at least a portion of the copper is plated with tin.

5. The substrate strip of claim 3, wherein at least a portion of the copper is plated with a tin alloy.

6. The substrate strip of claim 3, wherein at least a portion of the copper is plated with a nickel-gold alloy.

7. A substrate strip of a leadless three-dimensional stackable semiconductor package, the substrate strip comprising:
   an integrated circuit die mounting area including:
   a pair of parallel leadless outer portions, each leadless outer portion having a plurality of sections electrically isolated from each other and having a flat wire bonding area and a sidewall essentially perpendicular to the flat wire bonding area, the flat wire bonding area and the sidewall being integral, an outer side surface of the sidewall of each outer portion of the pair of outer portions being disposed at and forming a substantially continuous outermost edge of the integrated circuit die mounting area; and an inner portion located between and electrically isolated from the pair of outer portions, the inner portion having a thickness that is less than a height of the sidewall of each outer portion of the pair of outer portions and being configured to serve as an attachment area for an integrated circuit die, wherein the thickness of the inner portion is sized to accommodate an attached integrated circuit die, such that a top surface of the attached integrated circuit die is disposed below a top of the sidewall.

8. The substrate strip of claim 7, wherein a plurality of integrated circuit die mounting areas are arranged in a matrix pattern.

9. The substrate strip of claim 7, wherein the outer portion and the inner portion comprise copper.

10. The substrate strip of claim 9, wherein at least a portion of the copper is plated with tin.

11. The substrate strip of claim 9, wherein at least a portion of the copper is plated with a tin alloy.

12. The substrate strip of claim 9, wherein at least a portion of the copper is plated with a nickel-gold alloy.

13. A leadless three-dimensional stackable semiconductor package comprising:

a leadless outer portion including a plurality of sections electrically isolated from each other and having a flat wire bonding area and a sidewall essentially perpendicular to the flat wire bonding area, the flat wire bonding area and the sidewall being integral, an outer side surface of the sidewall being disposed at and forming a substantially continuous outermost edge of the semiconductor package;

an inner portion located within and electrically isolated from the outer portion, the inner portion having a thickness that is less than a height of the sidewall of the outer portion and being configured to serve as an attachment area for an integrated circuit die, wherein the thickness of the inner portion is sized to accommodate an attached integrated circuit die, such that a top surface of the attached integrated circuit die is disposed below a top of the sidewall; and an encapsulant substantially formed over both the outer portion and the inner portion while leaving an uppermost portion of the sidewall, a lowermost portion of the sidewall, and the outer side surface of the sidewall exposed.

14. The leadless three-dimensional stackable semiconductor package of claim 13, wherein at least the uppermost portion and the lowermost portion of the sidewall are plated with an electrically-conductive and non-oxidizing material.

* * * * *

UNITED STATES PATENT AND TRADEMARK OFFICE
CERTIFICATE OF CORRECTION

| | | |
|---|---|---|
| PATENT NO. | : 7,816,769 B2 | |
| APPLICATION NO. | : 11/467786 | |
| DATED | : October 19, 2010 | |
| INVENTOR(S) | : Ken M. Lam | |

It is certified that error appears in the above-identified patent and that said Letters Patent is hereby corrected as shown below:

In column 1, line 25, delete "that" and insert -- than --, therefor.

In column 1, line 47, delete "groves." and insert -- grooves. --, therefor.

In column 2, line 17, delete "contracts" and insert -- contacts --, therefor.

In column 4, line 25, delete "PD" and insert -- Pd --, therefor.

In column 5, line 46, delete "sigulated" and insert -- singulated --, therefor.

In column 6, line 7, delete "know" and insert -- known --, therefor.

Signed and Sealed this
Fourth Day of January, 2011

David J. Kappos
*Director of the United States Patent and Trademark Office*